United States Patent
Misono (10) Patent No.: US 9,239,495 B2
(45) Date of Patent: Jan. 19, 2016

(54) DISPLAY DEVICE, ELECTRONIC DEVICE INCLUDING DISPLAY DEVICE, AND METHOD FOR MANUFACTURING DISPLAY DEVICE

(75) Inventor: Kenji Misono, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 226 days.

(21) Appl. No.: 14/113,635

(22) PCT Filed: Apr. 20, 2012

(86) PCT No.: PCT/JP2012/002764
§ 371 (c)(1),
(2), (4) Date: Oct. 24, 2013

(87) PCT Pub. No.: WO2012/147322
PCT Pub. Date: Nov. 1, 2012

(65) Prior Publication Data
US 2014/0049742 A1 Feb. 20, 2014

(30) Foreign Application Priority Data
Apr. 27, 2011 (JP) .................................. 2011-099042

(51) Int. Cl.
*G02F 1/1345* (2006.01)
*G02F 1/1339* (2006.01)
(Continued)

(52) U.S. Cl.
CPC .............. *G02F 1/1339* (2013.01); *H05B 33/04* (2013.01);
(Continued)

(58) Field of Classification Search
CPC ................. G02F 1/1341; G02F 2001/133388;
G02F 1/133305; G02F 2202/28; G02F 1/1345;
G02F 1/13452; G02F 1/1339; G02F 1/13306;
G02F 2001/133325; G09G 2300/0426; H05B 33/04; H05B 33/10; H01L 51/5246
USPC .............................. 349/61–67, 149–153, 190
See application file for complete search history.

(56) References Cited

U.S. PATENT DOCUMENTS 5,290,197 A * 3/1994 Ohnuma et al. ................. 445/24
5,400,160 A * 3/1995 Takahashi et al. .............. 349/60
(Continued)

FOREIGN PATENT DOCUMENTS

JP 07093125 A * 4/1995 .............. G06F 3/147
JP 2005-122078 A 5/2005
(Continued)

OTHER PUBLICATIONS

Official Communication issued in International Patent Application No. PCT/JP2012/002764, mailed on May 29, 2012.

*Primary Examiner* — Hoan C Nguyen
(74) *Attorney, Agent, or Firm* — Keating & Bennett, LLP (57) ABSTRACT

Included are a first glass substrate (20) and a second glass substrate (30) facing each other, the peripheries of the substrates (20, 30) being superposed with each other, a display medium layer (25) between the substrates (20, 30) in a display area (D), a sealing member (26) for bonding the substrates (20, 30) together in a frame region (F) between the substrates (20, 30) and enclosing a display medium layer (25) between the substrates (20, 30), a flexible resin substrate layer (7) extending outward from between the frame region (F) of the first substrate (20) and the sealing member (26), and driving electronic components (41, 42) mounted on the resin substrate layer (7).

1 Claim, 9 Drawing Sheets (51) Int. Cl.
  *H05B 33/04* (2006.01)
  *H05B 33/10* (2006.01)
  *G02F 1/133* (2006.01)
  *G02F 1/1333* (2006.01)
  *H01L 51/52* (2006.01)

(52) U.S. Cl.
  CPC ........... *H05B 33/10* (2013.01); *G02F 1/13306* (2013.01); *G02F 1/133305* (2013.01); *G02F2001/133325* (2013.01); *H01L 51/5246* (2013.01)

(56) References Cited

U.S. PATENT DOCUMENTS

| | | | | |
|---|---|---|---|---|
| 6,163,357 | A | * | 12/2000 | Nakamura ............ 349/155 |
| 2004/0109665 | A1 | * | 6/2004 | Shinojima ............ 385/146 |
| 2010/0208188 | A1 | * | 8/2010 | Tsai et al. ............ 349/153 |

FOREIGN PATENT DOCUMENTS

| | | |
|---|---|---|
| JP | 2006-243008 A | 9/2006 |
| JP | 2008-275894 A | 11/2008 |

* cited by examiner

FIG. 9

DISPLAY DEVICE, ELECTRONIC DEVICE INCLUDING DISPLAY DEVICE, AND METHOD FOR MANUFACTURING DISPLAY DEVICE

TECHNICAL FIELD

The present invention relates to a display device, an electronic device including the display device, and a method for manufacturing the display device and more particularly to a technique of narrowing the frame width of a display device.

BACKGROUND ART

Display devices, such as liquid crystal displays, include a display area for displaying images and a frame region surrounding the display area. There is a constant demand for frame narrowing, namely, decreasing the width of the frame region.

For example, Patent Literature 1 discloses a liquid crystal display device in which a flexible printed circuit (FPC) is bonded to an end face of a transparent substrate using a joint member while the flexible printed circuit is compactly folded along the end face of the transparent substrate.

Patent Literature 2 discloses a liquid crystal display panel in which a first half of parallel display electrodes are drawn to a first terminal portion side at one end of a substrate and are connected to an electrode terminal disposed on the first terminal portion and the other second half of the parallel display electrodes are drawn to a second terminal portion side at the other end of the substrate and are connected to another electrode terminal disposed on the first terminal portion via an external wire.

Patent Literature 3 discloses a display device that has a through-hole passing through a region of an active-matrix substrate facing an input terminal of a driver integrated circuit (IC) in the thickness direction and a FPC connected to an input terminal of a driver IC through the through-hole from the back side of the active-matrix substrate.

CITATION LIST

Patent Literature

PTL 1: Japanese Unexamined Patent Application Publication No. 2005-122078
PTL 2: Japanese Unexamined Patent Application Publication No. 2006-243008
PTL 3: Japanese Unexamined Patent Application Publication No. 2008-275894

SUMMARY OF INVENTION

Technical Problem

Display devices, such as liquid crystal display devices, have a terminal region along at least one side of a frame region surrounding a rectangular display area. In a display device including an active-matrix substrate and a counter substrate facing each other, the terminal region is generally disposed on a protruding surface (on the counter substrate side) of the active-matrix substrate. The terminal region of a display device includes electronic components, such as an IC chip and a FPC, for driving the display device. In known display devices, therefore, the terminal region requires an area for mounting such driving electronic components. Such electronic component packaging limits frame narrowing.

In view of such situations, it is an object of the present invention to reduce the width of a frame region as much as possible.

Solution to Problem

To this end, in accordance with the present invention, the periphery of a first substrate overlaps the periphery of a second substrate facing the first substrate, and driving electronic components are mounted on a flexible resin substrate layer extending outward from between a frame region of the first substrate and a sealing member.

A display device according to the present invention includes a first substrate and a second substrate facing each other, the periphery of the first substrate overlapping the periphery of the second substrate, each of the first substrate and the second substrate having a defined display area for image display and being made of glass; a display medium layer between the first substrate and the second substrate in the display area; a sealing member between the first substrate and the second substrate, the sealing member bonding the first substrate and the second substrate together in a frame region along the peripheries of the first substrate and the second substrate, the sealing member enclosing the display medium layer between the first substrate and the second substrate; a flexible resin substrate layer extending outward from between the frame region of the first substrate and the sealing member; and a driving electronic component on the resin substrate layer.

Since the periphery of the first substrate overlaps the periphery of the second substrate facing the first substrate, for example, there is no conventional terminal region defined on a protruding surface of the active-matrix substrate on the counter substrate side. Instead of the conventional terminal region, the flexible resin substrate layer extends outward from between the frame region of the first substrate and the sealing member, and a driving electronic component is mounted on the resin substrate layer. Since the flexible resin substrate layer on which an electronic component is mounted can easily be folded, the flexible resin substrate layer can be placed in the device so as not to affect image display. Thus, the frame region does not include a region on which driving electronic components are mounted and substantially only includes a region for the sealing member disposed between the first substrate and the second substrate. Thus, the width of the frame region can be reduced as much as possible.

The display medium layer may be a liquid crystal layer, a backlight may be disposed on the first substrate opposite the display medium layer, and the electronic component may be disposed on top of the backlight opposite the first substrate.

In this structure, the driving electronic component mounted on the resin substrate layer is disposed on top of the backlight opposite the first substrate and can be disposed in the display area without affecting image display.

An electronic device according to the present invention includes a matrix of the display devices.

In this structure, since the width of the frame region in each of the display devices is reduced as much as possible, a matrix of display devices can constitute a large screen electronic device (a multi-display device) with the seams between the display devices being invisible (seamless).

An electronic device according to the present invention includes a pair of the display devices foldably joined together.

In this structure, since the width of the frame region in each of the display devices is reduced as much as possible, a pair of display devices foldably joined together can realize a collapsible electronic device (electronic tablet) having a narrow frame (that allows display on two screens by spreading the pair of display devices like a book).

A method for manufacturing a display device according to the present invention includes the steps of forming a display area for image display on a glass substrate and forming a flexible resin substrate layer on the outside of the display area to manufacture a first original substrate; forming a display area for image display on a glass substrate to manufacture a second substrate; placing a sealing member around the display area of the first original substrate or the second substrate, and bonding the first original substrate and the second substrate together such that the display areas are superposed with each other with the sealing member and a display medium layer inside the sealing member interposed therebetween, thereby manufacturing a laminate; mounting a driving electronic component on the resin substrate layer in the first original substrate of the laminate; and removing a portion of the glass substrate outside the sealing member disposed on the back side of the resin substrate layer on which the electronic component has been mounted such that the periphery of the first substrate overlaps the periphery of the second substrate.

In accordance with this method, since the periphery of the first substrate manufactured in the step of removing a substrate overlaps the periphery of the second substrate manufactured in the step of manufacturing a second substrate, for example, there is no conventional terminal region defined on a protruding surface of the active-matrix substrate on the counter substrate side. Instead of the conventional terminal region, the resin substrate layer is formed on the outside of the display area of the first original substrate in the step of manufacturing a first original substrate. In the mounting step after the bonding step, the driving electronic component is mounted on a surface of the resin substrate layer in the first original substrate. In the step of removing a substrate, the glass substrate on the back side of the resin substrate layer on which the electronic component has been mounted is partly removed. Since the glass substrate is disposed on the back side of the resin substrate layer when the electronic component is mounted, the electronic component can be securely mounted on the resin substrate layer. After the electronic component is mounted, the glass substrate on the back side of the resin substrate layer is removed. Thus, the flexible resin substrate layer can easily be folded and housed in the apparatus so as not to affect image display. Thus, the frame region does not include a region on which driving electronic components are mounted and substantially only includes a region for the sealing member disposed between the first substrate and the second substrate. Thus, the width of the frame region can be reduced as much as possible.

The step of removing a substrate may involve laser beam irradiation from the back side of the resin substrate layer to separate the resin substrate layer from the portion of the glass substrate to be removed.

In this case, in the step of removing a substrate, laser beam irradiation from the back side of the resin substrate layer to separate the resin substrate layer from the portion of the glass substrate to be removed causes an ablation (decomposition/vaporization of a film due to heat absorption) phenomenon on the resin substrate layer side at the interface between the glass substrate and the resin substrate layer due to absorption of the laser beam, thereby separating the glass substrate from the resin substrate layer.

Advantageous Effects of Invention

In accordance with the present invention, the periphery of a first substrate overlaps the periphery of a second substrate facing the first substrate, and driving electronic components are mounted on a flexible resin substrate layer extending outward from between a frame region of the first substrate and a sealing member. Thus, the width of the frame region can be reduced as much as possible.

DESCRIPTION OF EMBODIMENTS

The present invention will be further described in the following embodiments with reference to the drawings. The present invention is not limited to these embodiments.

First Embodiment

Figure 1:
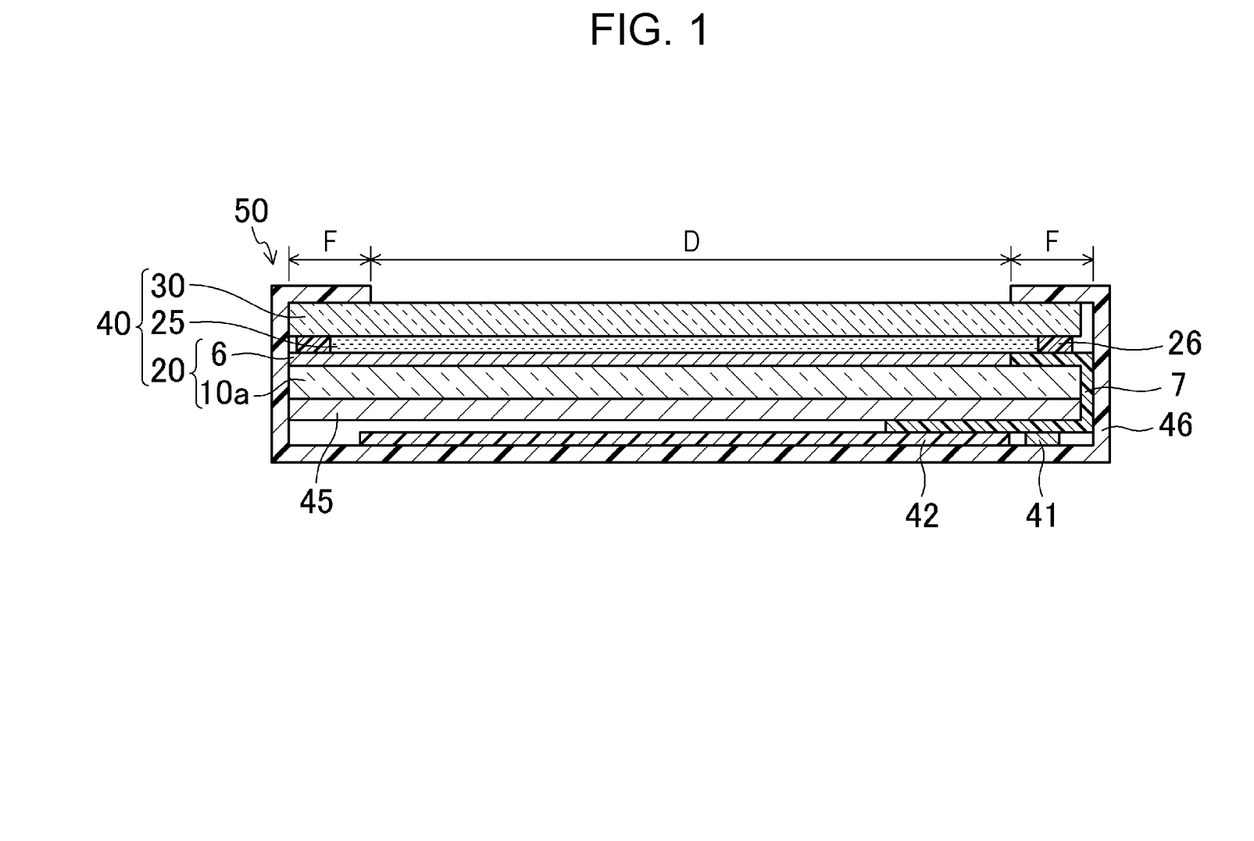
FIG. 1 is a cross-sectional view of a liquid crystal display device according to a first embodiment.
Figure 2:
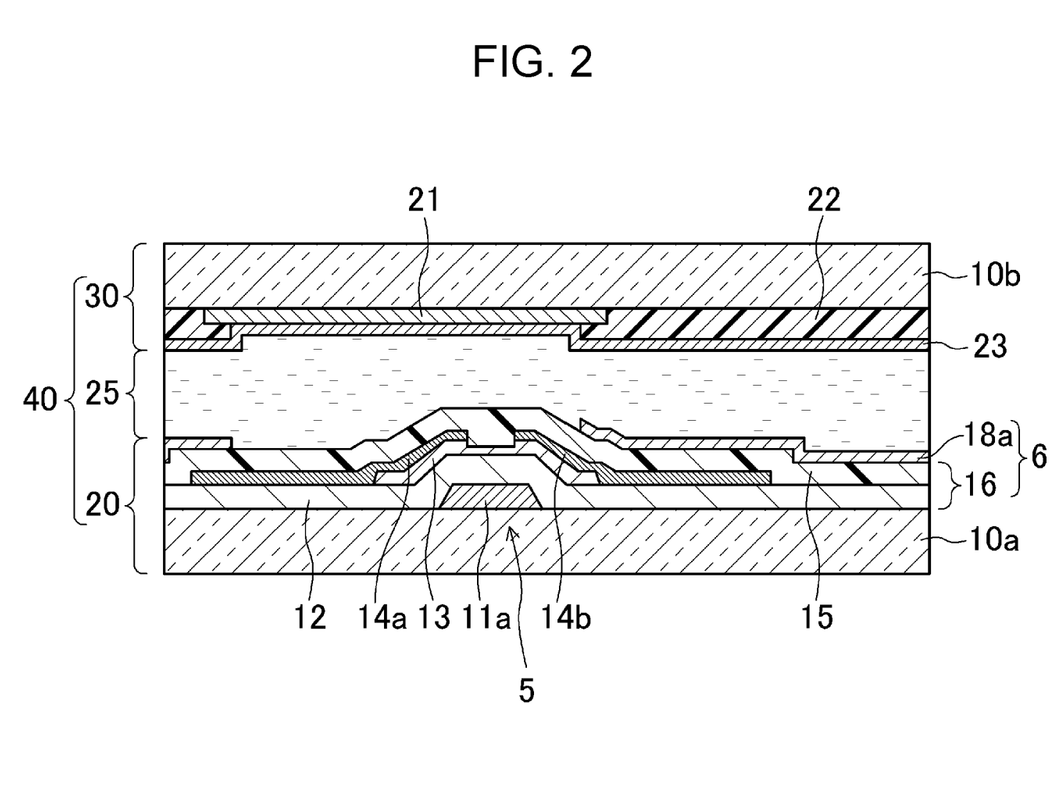
FIG. 2 is a cross-sectional view of a liquid crystal display panel that constitutes the liquid crystal display device according to the first embodiment.
Figure 3:
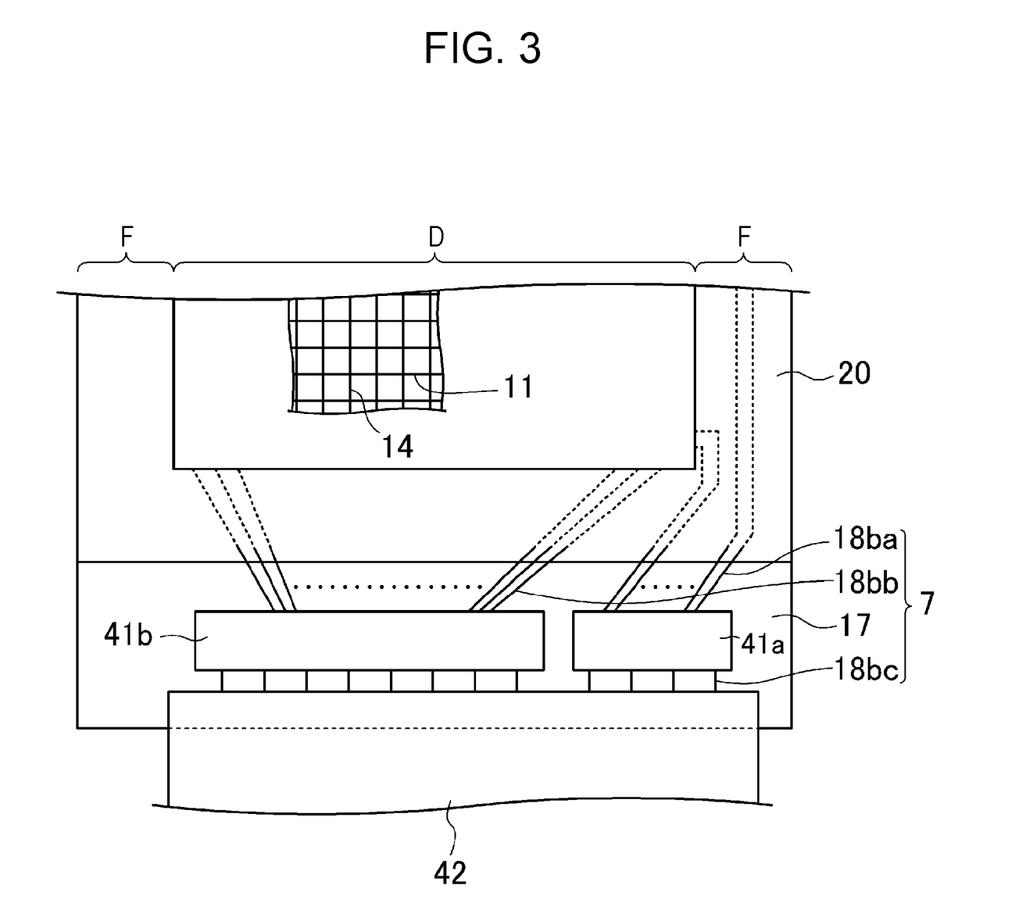
FIG. 3 is a plan view of a resin substrate layer that constitutes the liquid crystal display device according to the first embodiment.
Figure 4:
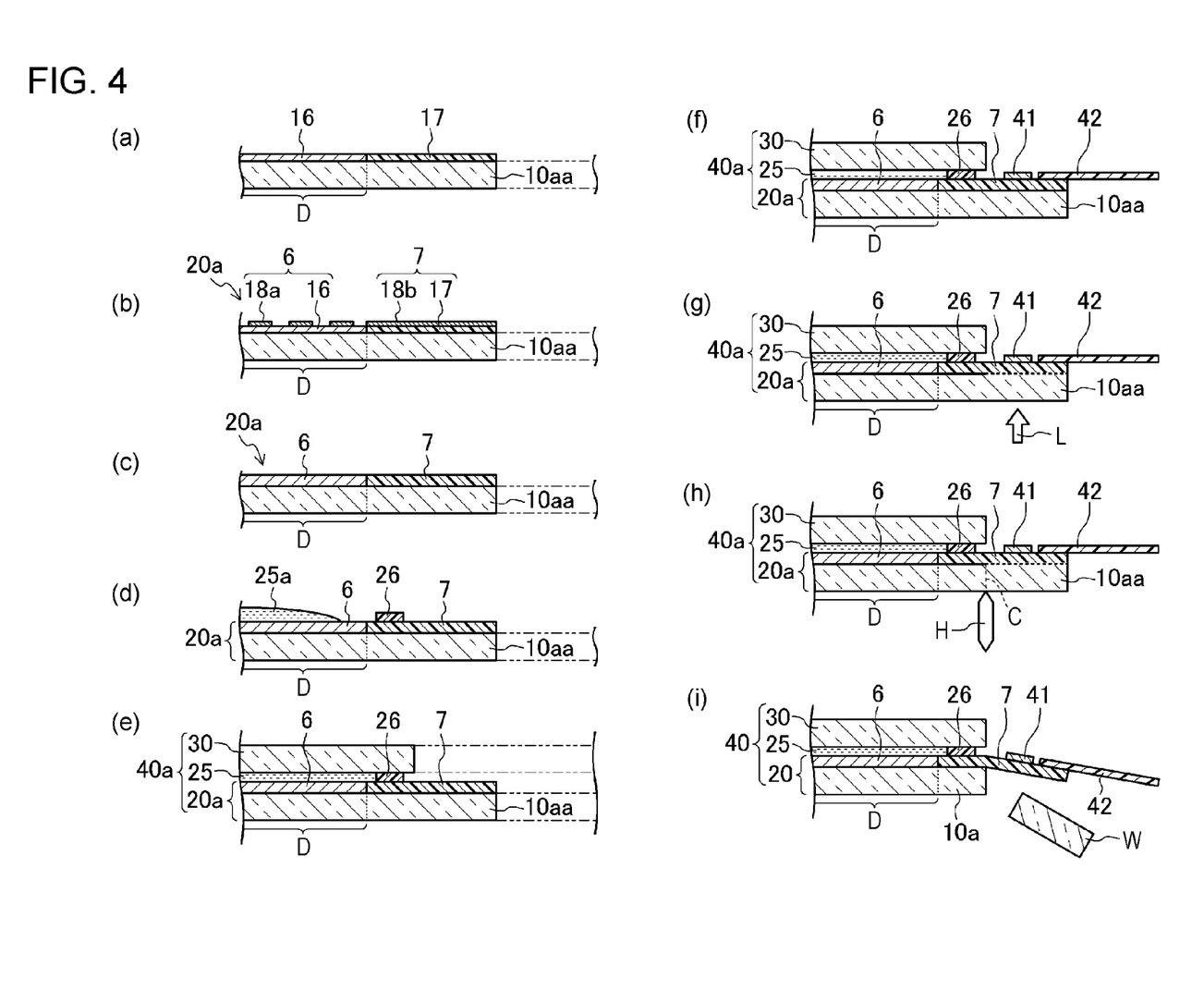
FIG. 4 is a cross-sectional explanatory view of a method for manufacturing the liquid crystal display device according to the first embodiment.
Figure 5:
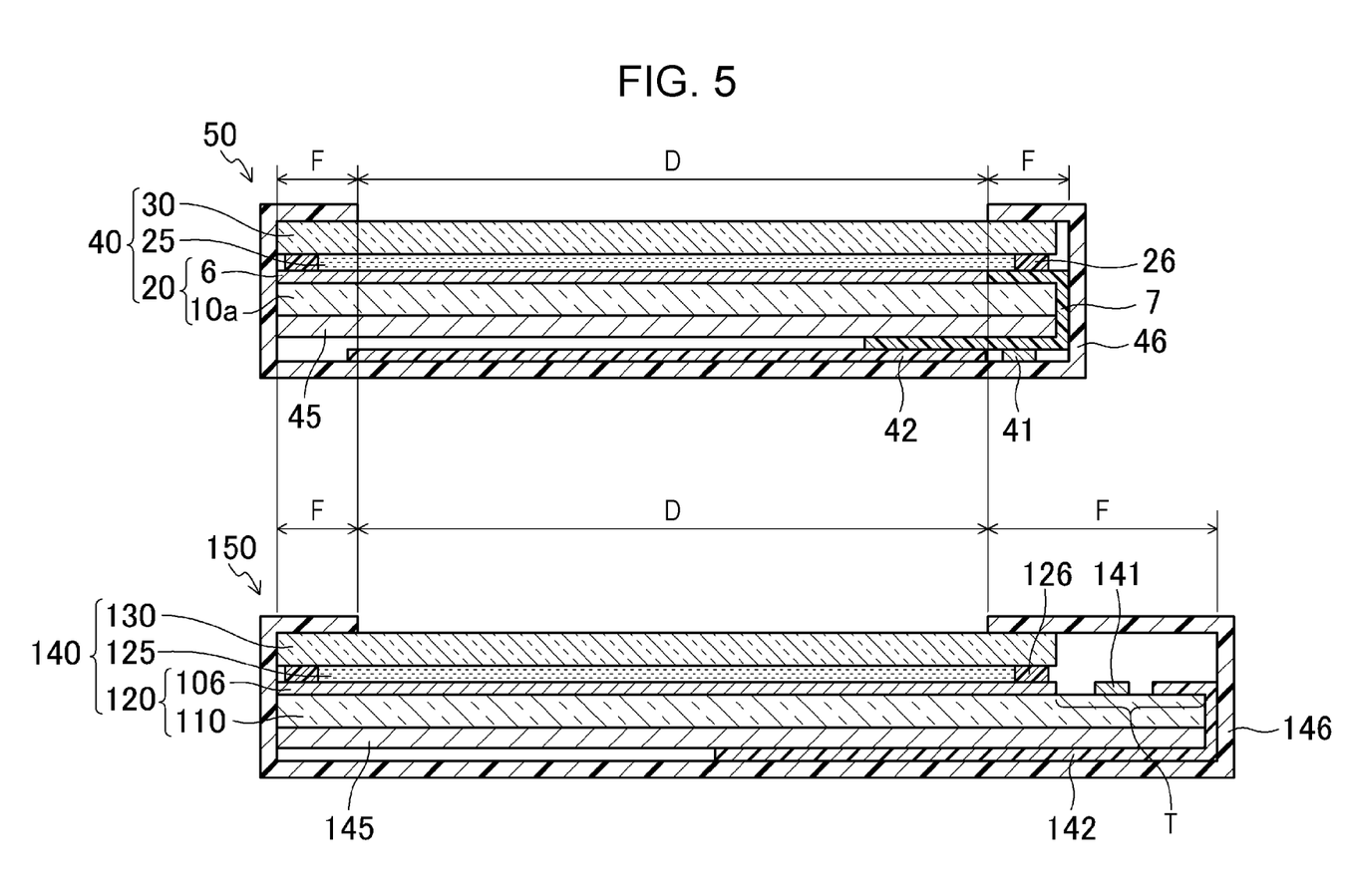
FIG. 5 is an explanatory view for illustrating an advantage of the liquid crystal display device according to the first embodiment.

FIGS. 1 to 5 illustrate a display device and a method for manufacturing the display device according to a first embodiment of the present invention. More specifically, FIG. 1 is a cross-sectional view of a liquid crystal display device 50 according to the present embodiment. FIG. 2 is a cross-sectional view of a liquid crystal display panel 40 that constitutes the liquid crystal display device 50. FIG. 3 is a plan view of a resin substrate layer 7 that constitutes the liquid crystal display device 50. FIG. 4 is a cross-sectional explanatory view of a method for manufacturing the liquid crystal display device 50. FIG. 5 is an explanatory view for illustrating an advantage of the liquid crystal display device 50.

As illustrated in FIG. 1, the liquid crystal display device 50 includes the liquid crystal display panel 40, a backlight 45 disposed under the liquid crystal display panel 40, an optical sheet (not shown), such as a diffusion sheet, disposed between the liquid crystal display panel 40 and the backlight 45, the resin substrate layer 7 extending from one end of the liquid crystal display panel 40, an IC chip 41 and a FPC 42 mounted as electronic components on the resin substrate layer 7 under the backlight 45, and a plastic chassis 46 for housing the liquid crystal display panel 40, the backlight 45, the optical sheet, the resin substrate layer 7, the IC chip 41, and the FPC 42. The IC chip 41 is a general term for a gate driver IC chip 41*a* (see FIG. 3) and a source driver IC chip 41*b* (see FIG. 3) described below.

As illustrated in FIGS. 1 and 2, the liquid crystal display panel 40 includes an active-matrix substrate 20 as a first substrate, a counter substrate 30 as a second substrate facing the active-matrix substrate 20, a liquid crystal layer 25 as a display medium layer disposed between the active-matrix substrate 20 and the counter substrate 30, and a sealing member 26 for bonding the active-matrix substrate 20 and the counter substrate 30 together and enclosing the liquid crystal layer 25 between the active-matrix substrate 20 and the counter substrate 30. As illustrated in FIG. 1, the liquid crystal display panel 40 includes a rectangular display area D and a frame region F surrounding the display area D. The display area D includes a matrix of subpixels, which are the smallest units of an image. The frame region F includes the sealing member 26. A polarizing plate (not shown) is disposed on the front and back sides of the liquid crystal display panel 40. In the liquid crystal display panel 40, the periphery of the active-matrix substrate 20 overlaps the periphery of the counter substrate 30. The sentence "the periphery of the active-matrix substrate 20 overlaps the periphery of the counter substrate 30" means that the positional discrepancy between the peripheries is approximately ±0.2 mm or less as viewed from the top.

As illustrated in FIGS. 2 and 3, the active-matrix substrate 20 includes an insulating substrate 10*a*, such as a glass substrate, a plurality of gate lines 11 parallel to each other disposed on the insulating substrate 10*a*, a gate-insulating film 12 covering the gate lines 11, a plurality of source lines 14 being perpendicular to the gate lines 11 and being disposed on the gate-insulating film 12, a plurality of thin film transistors (TFTs) 5 disposed on the intersecting portions between the gate lines 11 and the source lines 14 and corresponding to respective subpixels, an interlayer insulating film 15 covering the TFTs 5, a matrix of pixel electrodes 18*a* disposed on the interlayer insulating film 15 and connected to the corresponding TFTs 5, and an oriented film (not shown) covering the pixel electrodes 18*a*. A capacity line for auxiliary capacity may be disposed between adjacent gate lines 11.

As illustrated in FIG. 3, the gate lines 11 in the display area D are parallel to each other in the transverse direction, converge on the resin substrate layer 7 side in the frame region F, and are connected to the gate driver IC chip 41*a* via a wiring pattern 18*ba* on the resin substrate layer 7.

As illustrated in FIG. 3, the source lines 14 in the display area D are parallel to each other in the vertical direction, converge on the resin substrate layer 7 side in the frame region F, and are connected to the source driver IC chip 41*b* via a wiring pattern 18*bb* on the resin substrate layer 7.

As illustrated in FIG. 2, each of the TFTs 5 includes a gate electrode 11*a* on the insulating substrate 10*a*, the gate-insulating film 12 covering the gate electrode 11*a*, an island-shaped semiconductor layer 13 disposed on the gate-insulating film 12 and covering the gate electrode 11*a*, and a source electrode 14*a* and a drain electrode 14*b* on the semiconductor layer 13. The source electrode 14*a* is separated from the drain electrode 14*b*. In the present embodiment, as illustrated in FIG. 2, a multilayer film up to the interlayer insulating film 15 disposed on the insulating substrate 10*a* is referred to as a TFT array layer 16. The pixel electrodes 18*a* are disposed on the TFT array layer 16. A multilayer film up to the pixel electrodes 18*a* disposed on the insulating substrate 10*a* is referred to as a pixel electrode array layer 6.

The gate electrode 11*a* may be a protrusion of each of the gate lines 11 from the corresponding subpixel.

The semiconductor layer 13 may include an intrinsic amorphous silicon layer having a channel region (not shown) and an $n^+$ amorphous silicon layer (not shown) disposed on the intrinsic amorphous silicon layer such that the channel region is exposed. The $n^+$ amorphous silicon layer is connected to the source electrode 14*a* and the drain electrode 14*b*.

The source electrode 14*a* may be a protrusion of each of the source lines 14 from the corresponding subpixel.

The drain electrode 14*b* is connected to the corresponding pixel electrode 18*a* through a contact hole (not shown) formed in the interlayer insulating film 15.

As illustrated in FIG. 2, the counter substrate 30 includes an insulating substrate 10*b*, such as a glass substrate, a black matrix 21 disposed in a grid-like fashion on the insulating substrate 10*b*, a plurality of color layers 22, such as a red layer, a green layer, and a blue layer, disposed between the lattices of the black matrix 21, a common electrode 23 covering the black matrix 21 and each of the color layers 22, a plurality of columnar photo spacers (not shown) on the common electrode 23, and an oriented film (not shown) covering the common electrode 23 and each of the photo spacers.

The liquid crystal layer 25 is made of a nematic liquid crystal material having electro-optical characteristics and other materials.

As illustrated in FIG. 1, the resin substrate layer 7 extends outward from between the frame region F of the active-matrix substrate 20 and the sealing member 26. As illustrated in FIG. 3, the resin substrate layer 7 includes a substrate layer 17 made of a heat-resistant resin material and wiring patterns 18*ba*, 18*bb*, and 18*bc* disposed on the substrate layer 17. The resin substrate layer 7 is flexible. As illustrated in FIG. 1, the resin substrate layer 7 is folded along end faces of the insulating substrate 10*a* and the backlight 45. The wiring pattern 18*bc* is configured to connect the gate driver IC chip 41*a* and the source driver IC chip 41*b* to the FPC 42.

The backlight 45 may include a light guide plate (not shown), a light source (not shown), such as a light emitting diode (LED), disposed along one side surface of the light guide plate, and a reflection sheet (not shown) disposed on the back side of the light guide plate.

As illustrated in FIG. 1, the chassis 46 has an opening so that the display area D of the liquid crystal display panel 40 is exposed.

In the liquid crystal display device 50, a predetermined voltage is applied to the liquid crystal layer 25 between the pixel electrode 18*a* disposed on the active-matrix substrate 20 and the common electrode 23 disposed on the counter substrate 30 in each subpixel to change the orientation state of the liquid crystal layer 25, thereby altering the transmittance of light from the backlight 45 in each subpixel in order to display images.

An exemplary method for manufacturing the liquid crystal display device 50 according to the present embodiment will be described below with reference to FIG. 4. A method for manufacturing the liquid crystal display device 50 according to the present embodiment includes a step of manufacturing an active-matrix original substrate, a step of manufacturing a counter substrate, a bonding step, a mounting step, and a step of removing a substrate. The chain double-dashed lines in FIGS. 4(*a*) to 4(*e*) indicate a large mother glass. Thus, the liquid crystal display device 50 according to the present embodiment is manufactured such that a plurality of cells are simultaneously manufactured.

<Step of Manufacturing Active-Matrix Original Substrate>

First, a molybdenum film (having a thickness of approximately 150 nm) is formed on the entire surface of the insulating substrate 10*aa*, such as a glass substrate having a thickness of approximately 0.7 mm, for example, by sputtering. The molybdenum film is then subjected to photolithography, etching, resist removal, and washing to form the gate lines 11 and the gate electrode 11a.

A silicon nitride film (having a thickness in the range of approximately 100 to 600 nm) is then formed, for example, by plasma chemical vapor deposition (CVD), on the entire substrate on which the gate lines 11 and the gate electrode 11a have been formed, thereby forming the gate-insulating film 12.

An intrinsic amorphous silicon film (having a thickness of approximately 100 nm) and then a phosphorus-doped n$^+$ amorphous silicon film (having a thickness of approximately 50 nm) are formed on the entire substrate on which the gate-insulating film 12 has been formed, for example, by plasma CVD. The multilayer film of the intrinsic amorphous silicon film and the n$^+$ amorphous silicon film was subjected to photolithography, etching, resist removal, and washing to form a semiconductor layer formed portion (13).

A titanium film (having a thickness in the range of approximately 20 to 150 nm) and then an aluminum film (having a thickness in the range of approximately 50 to 400 nm) are formed, for example, by sputtering on the entire substrate on which the semiconductor layer formed portion (13) has been formed. This multilayer metal film is subjected to photolithography, etching, resist removal, and washing to form the source lines 14, the source electrode 14a, and the drain electrode 14b.

Subsequently, the n$^+$ amorphous silicon film in the semiconductor layer formed portion is etched using the source electrode 14a and the drain electrode 14b as a mask to form a channel region, thereby forming the semiconductor layer 13 and the TFTs 5 each including the semiconductor layer 13.

A silicon nitride film (having a thickness of approximately 300 nm) is formed, for example, by plasma CVD on the entire substrate on which the TFTs 5 have been formed. The silicon nitride film is then subjected to photolithography, etching, resist removal, and washing to form the interlayer insulating film 15.

In this manner, the TFT array layer 16 (see FIG. 4(a)) is formed on the insulating substrate 10aa.

Subsequently, a polyamic acid is applied, for example, with an offset press more than once (for example, three times) to a portion outside the display region D of the insulating substrate 10aa on which the TFT array layer 16 has been formed. The polyamic acid is pre-baked (for example, on a hot plate at 80° C. for approximately 30 minutes) and baked (for example, in a nitrogen atmosphere in an oven at 300° C. for approximately 90 minutes) to form the substrate layer 17 made of a polyimide resin and having a thickness in the range of approximately 4 to 10 μm, as illustrated in FIG. 4(a). Although the polyamic acid is applied with the offset press to form the substrate layer in the present embodiment, the polyamic acid may be applied to a forming region after a water repellent is applied to a non-forming region, or a heat-resistant polymer film may be temporarily formed on a film material, such as polyethylene naphthalate (PEN), and then may be transferred to a predetermined region, thereby forming the substrate layer. The polyamic acid undergoes a cyclo-dehydration (imidization) reaction at 200° C. or more. Considering the mounting step involving thermocompression bonding at a temperature in the range of approximately 180° C. to 210° C. and variations caused by an apparatus used, however, the baking temperature is preferably 240° C. or more. Also considering the materials of electric wires formed on the substrate layer and the conditions for the formation of the electric wires (such as high temperature and reduced pressure), the baking temperature is more preferably 300° C. or more.

A transparent conductive film, such as an indium tin oxide (ITO) film or an indium zinc oxide (IZO) film, having a thickness in the range of approximately 50 to 200 nm is formed, for example, by sputtering on the entire substrate on which the substrate layer 17 has been formed. The transparent conductive film is then subjected to photolithography, etching, resist removal, and washing to form the pixel electrodes 18a and the wiring patterns 18b (18ba, 18bb, and 18bc), thereby forming the pixel electrode array layer 6 and the resin substrate layer 7, as illustrated in FIGS. 4(b) and 4(c). In FIG. 4(c) and subsequent figures in FIG. 4, each of the pixel electrode array layer 6 and the resin substrate layer 7 is illustrated as an elongated rectangular shape for the sake of simplicity. The wiring pattern 18b in FIG. 4(b) represents the wiring pattern 18ba, 18bb, and 18bc. Although the wiring patterns 18ba, 18bb, and 18bc are formed using the transparent conductive film in the present embodiment, the wiring patterns 18ba, 18bb, and 18bc may be formed using a multilayer film including the transparent conductive film and a metal film, such as an aluminum film or a titanium film.

Finally, a polyimide film is formed, for example, by printing on the entire substrate on which the pixel electrode array layer 6 and the resin substrate layer 7 have been formed. The polyimide film is then baked and rubbed to form an oriented film.

In this manner, a large active-matrix original substrate (20a) before cutting can be manufactured. Each cell of the large active-matrix original substrate (20a) includes the display area D and the resin substrate layer 7.

<Step of Manufacturing Counter Mother Substrate>

First, a black photosensitive resin is applied to the entire surface of the insulating substrate 10b, such as a glass substrate having a thickness of approximately 0.7 mm, for example, by spin coating or slit coating. The coating film is then exposed to light, developed, and baked to form the black matrix 21 having a thickness of approximately 1.0 μm.

Subsequently, a photosensitive resin, which is colored red, green, or blue, for example, is applied, for example, by spin coating or slit coating, to the entire substrate on which the black matrix 21 has been formed. The coating film is then exposed to light, developed, and baked to form one of the color layers 22 of the selected color (for example, a red layer) having a thickness of approximately 2.0 μm. The same procedure is repeatedly performed using photosensitive resins of the other two colors to form the color layers 22 of the other two colors (for example, a green layer and a blue layer) having a thickness of approximately 2.0%.

A transparent conductive film, such as an ITO film or an IZO film, having a thickness in the range of approximately 50 to 200 nm is then formed, for example, by sputtering on the entire substrate on which the color layers 22 have been formed, thereby forming the common electrode 23.

A photosensitive resin, such as a photosensitive acrylic resin, is applied, for example, by spin coating or slit coating to the entire substrate on which the common electrode 23 has been formed. The photosensitive resin film is exposed to light, developed, and baked to form the photo spacers each having a thickness of approximately 4.0 μm.

Finally, a polyimide film is formed, for example, by printing on the entire substrate on which the photo spacers have been formed. The polyimide film is then baked and rubbed to form an oriented film.

In this manner, a large counter substrate (30) before cutting can be manufactured. Each cell of the large counter substrate (30) includes the display area D.

<Bonding Step>

First, as illustrated in FIG. 4(d), the frame-shaped sealing member 26 made of an ultraviolet (UV) and heat curing resin surrounding the display area D is printed on a surface of the large active-matrix original substrate (20a) manufactured by the step of manufacturing an active-matrix original substrate. A liquid crystal material 25a is then dropped on the surface inside the seal member 26.

Subsequently, the active-matrix original substrate (20a) on which the liquid crystal material 25a has been dropped is bonded under reduced pressure to the large counter substrate (30) manufactured by the step of manufacturing a counter substrate such that the facing display areas D of the substrates are superposed with each other. The large laminate (40a) is then placed under atmospheric pressure to press the front and back side of the large laminate (40a).

After the sealing member 26 in the large laminate (40a) is irradiated with UV light, the large laminate (40a) is heated to cure the sealing member 26.

Finally, as illustrated in FIG. 4(e), the large laminate 40a after the sealing member 46 has been cured is cut, for example, by dicing into cells each including the active-matrix original substrate 20a and the counter substrate 30.

<Mounting Step>

As illustrated in FIG. 4(f), the IC chip 41 (the gate driver IC chip 41a and the source driver IC chip 41b) and the FPC 42 are mounted, for example, via an anisotropic conductive film (ACF) on the resin substrate layer 7 of the active-matrix original substrate 20a of the laminate 40a manufactured by the bonding step.

<Step of Removing Substrate>

First, as illustrated in FIG. 4(g), the active-matrix original substrate 20a of the laminate 40a on which the IC chip 41 and the FPC 42 have been mounted in the mounting step is irradiated from the back side, for example, with a laser beam L having a wavelength of 308 nm emitted from a XeCl excimer laser to cause an ablation (decomposition/vaporization of a film due to heat absorption) phenomenon on the resin substrate layer 7 side at the interface between the insulating substrate 10aa and the resin substrate layer 7 due to absorption of the laser beam L, thereby partly separating the resin substrate layer 7 from the insulating substrate 10aa. The region to be irradiated with the laser beam L is a protruding portion of the active-matrix original substrate 20a relative to the counter substrate 30 (see the broken line in FIG. 4(g)).

Subsequently, as illustrated in FIG. 4(h), the edge of a supersteel wheel H is brought into contact with and is rotated on the insulating substrate 10aa of the active-matrix original substrate 20a along the end face of the counter substrate 30 to cause a crack C on the back side of the insulating substrate 10aa and expand the crack C in the substrate thickness direction. As illustrated in FIG. 4(i), a substrate W is removed to manufacture the active-matrix substrate 20 and the liquid crystal display panel 40 including the active-matrix substrate 20.

An optical sheet and the backlight 45 are mounted on the active-matrix substrate 20 of the liquid crystal display panel 40. The resin substrate layer 7 is folded along the end faces of the active-matrix substrate 20 and the backlight 45. The liquid crystal display panel 40 and the backlight 45 are fixed in the chassis 46 with the resin substrate layer 7 being folded.

The liquid crystal display device 50 according to the present embodiment can be manufactured through these steps.

As described above, in accordance with the liquid crystal display device 50 and the method for manufacturing the liquid crystal display device 50 according to the present embodiment, the periphery of the active-matrix substrate 20 manufactured in the step of removing a substrate overlaps the periphery of the counter substrate 30 (cut into cells in the subsequent bonding step) manufactured in the step of manufacturing a counter substrate. Thus, for example, a conventional terminal region T on a protruding surface of an active-matrix substrate 120 on a counter substrate 130 side in a liquid crystal display device 150 illustrated in FIG. 5 can be eliminated. As illustrated in FIG. 5, the liquid crystal display device 150 according to a comparative example includes a liquid crystal display panel 140, a backlight 145 on the back side of the liquid crystal display panel 140, an IC chip 141 and a FPC 142 mounted on the liquid crystal display panel 140, and a chassis 146 for housing the liquid crystal display panel 140, the backlight 145, the IC chip 141, and the FPC 142. The liquid crystal display panel 140 includes the active-matrix substrate 120, which includes a pixel electrode array layer 106 on an insulating substrate 110, a counter substrate 130 facing the active-matrix substrate 120, and a liquid crystal layer 125 enclosed with a sealing member 126 between the substrates 120 and 130. The structure of the display area D and the frame region F on the left side in the figure is substantially the same as the structure of the liquid crystal display device 50 according to the present embodiment. In accordance with the liquid crystal display device 50 and the method for manufacturing the liquid crystal display device 50 according to the present embodiment, instead of the conventional terminal region T, the resin substrate layer 7 is formed on the outside of the display area D of the active-matrix original substrate 20a in the step of manufacturing an active-matrix original substrate. In the mounting step after the bonding step, the IC chip 41 for driving and the FPC 42 are mounted on a surface of the resin substrate layer 7 of the active-matrix original substrate 20a. In the step of removing a substrate, the insulating substrate 10aa on the back side of the resin substrate layer 7 on which the IC chip 41 and the FPC 42 have been mounted is partly removed. Since the insulating substrate 10aa is disposed on the back side of the resin substrate layer 7 when the IC chip 41 and the FPC 42 are mounted, the IC chip 41 and the FPC 42 can be securely mounted on the resin substrate layer 7. After the IC chip 41 and the FPC 42 are mounted, the insulating substrate 10aa on the back side of the resin substrate layer 7 is removed. Thus, the flexible resin substrate layer 7 can easily be folded and housed in the apparatus so as not to affect image display. The frame region F does not include a region on which the IC chip 41 and the FPC 42 are mounted and substantially only includes a region for the sealing member 26 disposed between the active-matrix substrate 20 and the counter substrate 30. Thus, the width of the frame region F can be reduced as much as possible, and the external size can be reduced.

In the liquid crystal display device 50 according to the present embodiment, since the IC chip 41 and the FPC 42 on the resin substrate layer 7 are disposed on top of the backlight 45 opposite the active-matrix substrate 20, the IC chip 41 and the FPC 42 can be disposed in the display area D without affecting image display. Thus, the width of the frame region F can be significantly reduced.

The TFTs 5 in the liquid crystal display device 50 according to the present embodiment are disposed on the glass substrate, which has little influence on the characteristics of the TFTs 5.

The resin substrate layer 7 on which the IC chip 41 and the FPC 42 are to be mounted in the liquid crystal display device 50 according to the present embodiment requires no optical transparency or optical isotropy. This can increase the choice of the material of the resin substrate layer 7.

Second Embodiment

Figure 6:
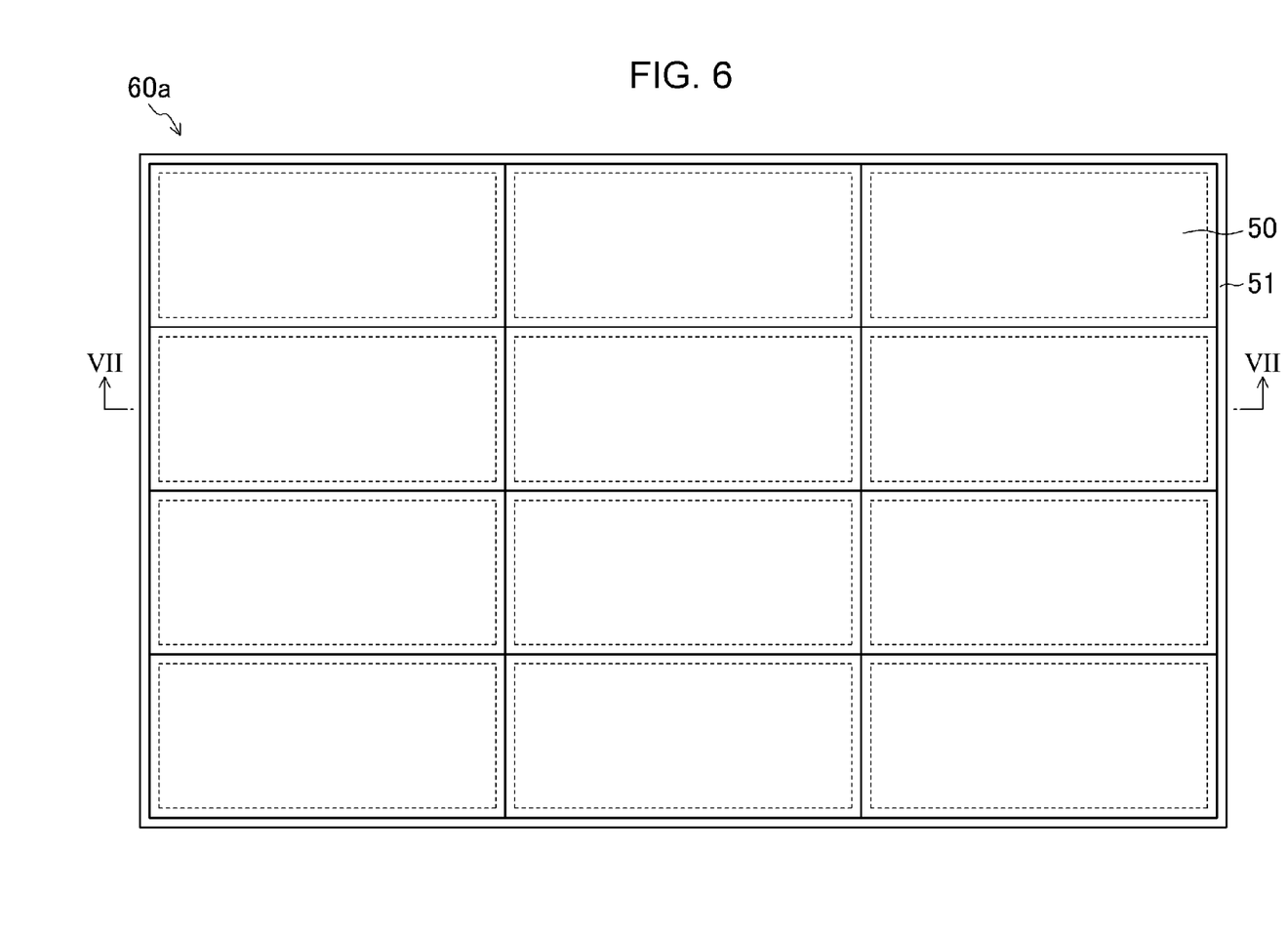
FIG. 6 is a plan view of a multi-display device that includes liquid crystal display devices according to a second embodiment.
Figure 7:
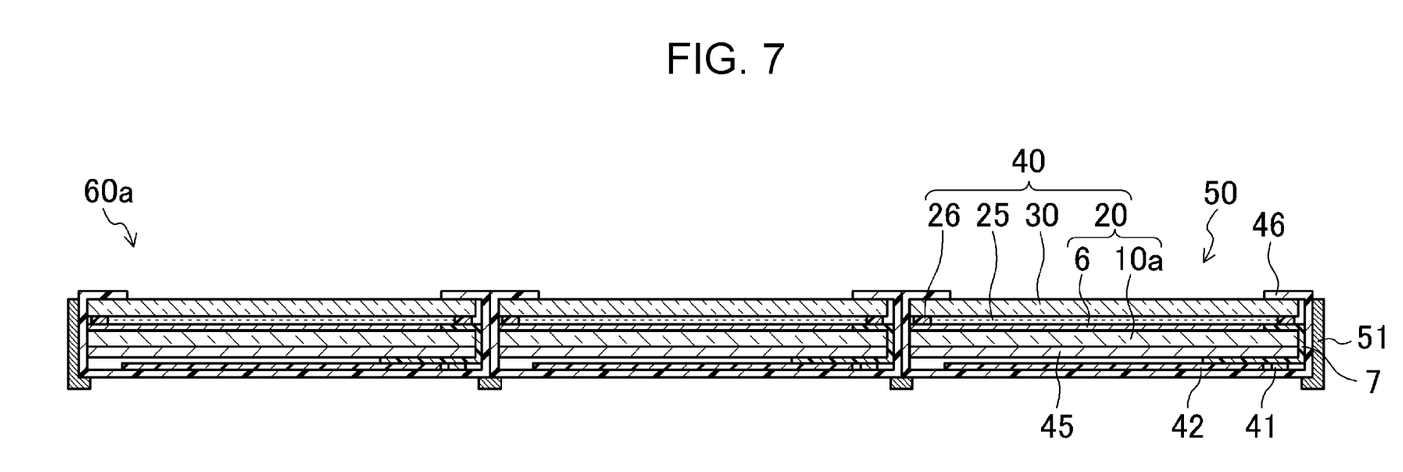
FIG. 7 is a cross-sectional view of the multi-display device taken along the line VII-VII in FIG. 6.

FIGS. 6 and 7 illustrate a display device and an electronic device according to a second embodiment of the present invention. More specifically, FIG. 6 is a plan view of a multi-display device 60a that includes liquid crystal display devices 50 according to the present embodiment. FIG. 7 is a cross-sectional view of the multi-display device 60a taken along the line VII-VII in FIG. 6. In the following embodiments, the same parts as in FIGS. 1 to 5 are denoted by the same reference numerals and will not be further described.

As illustrated in FIGS. 6 and 7, the multi-display device 60a includes a 3 by 4 (12) matrix of liquid crystal display devices 50 and a metallic frame 51 for housing the liquid crystal display devices 50. The liquid crystal display devices 50 in the multi-display device 60a are fixed to the frame 51 with metallic screws or plastic hooks.

The frame 51 is configured to be decomposed into a plurality of pieces and freely change its size depending on the configuration number of the liquid crystal display devices 50.

As described above, the width of the frame region F in each of the liquid crystal display devices 50 of the multi-display device 60a according to the present embodiment is reduced as much as possible. Thus, a matrix of the liquid crystal display devices 50 can constitute a seamless large screen electronic device with the seams between the liquid crystal display devices 50 being invisible.

Since the liquid crystal display devices 50 of the multi-display device 60a according to the present embodiment are unitized in the plastic chassis 46, the liquid crystal display devices 50 can easily be transported, and the breakage of the liquid crystal display devices 50 during transportation can be reduced.

Each of the liquid crystal display devices 50 of the multi-display device 60a according to the present embodiment is unitized, and the frame 51 can also be disassembled. Thus, the small units of the multi-display device 60a can easily be transported to a destination where a large screen is assembled.

Third Embodiment

Figure 8:
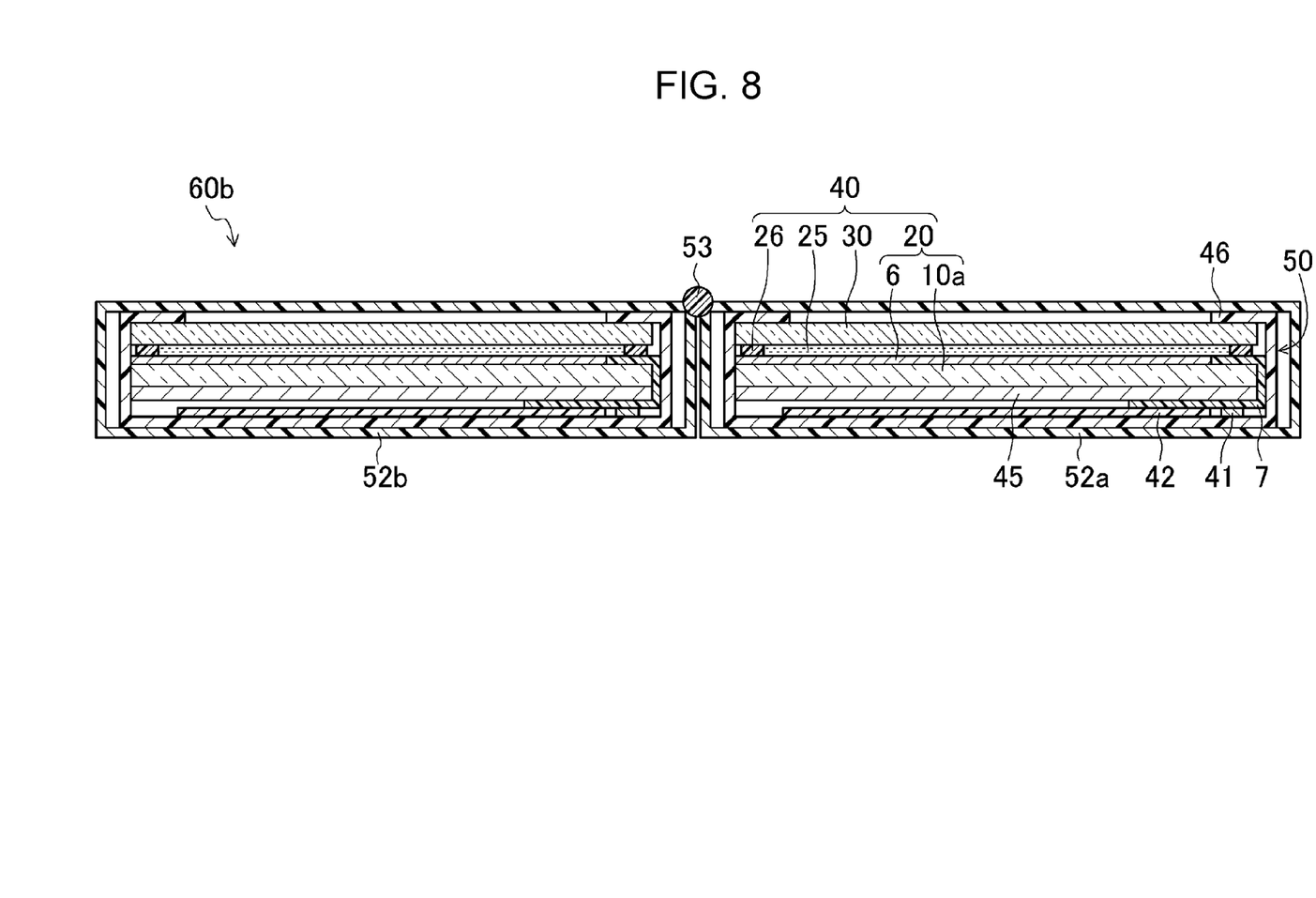
FIG. 8 is a cross-sectional view of an electronic tablet that includes a liquid crystal display device according to a third embodiment.
Figure 9:
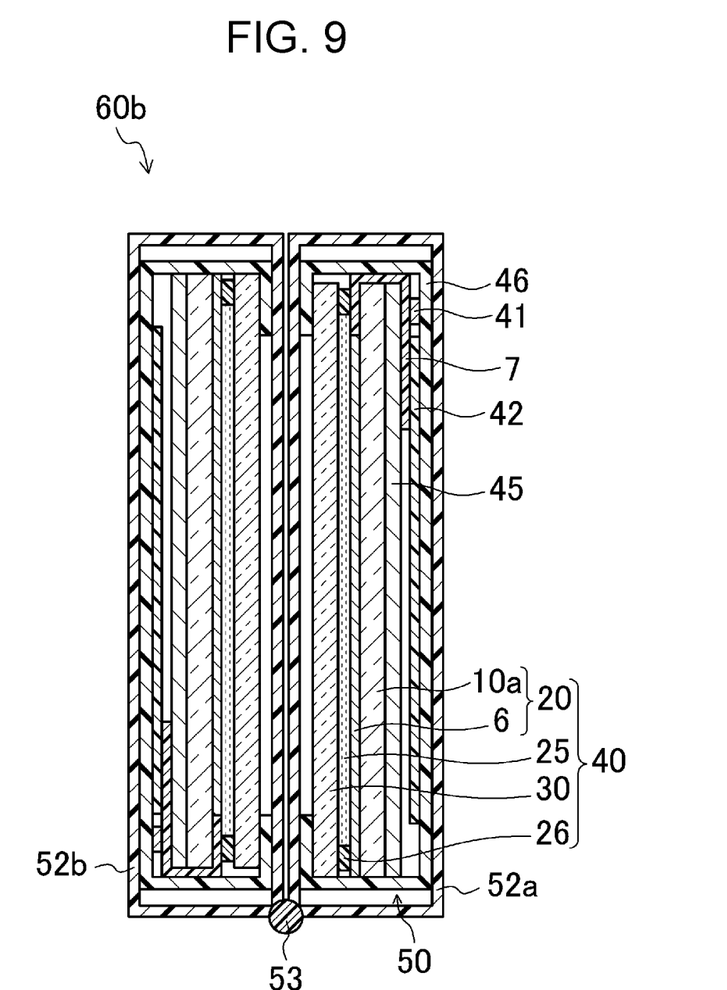
FIG. 9 is another cross-sectional view of the electronic tablet that includes the liquid crystal display device according to the third embodiment.

FIGS. 8 and 9 illustrate a display device and an electronic device according to a third embodiment of the present invention. More specifically, FIG. 8 is a cross-sectional view of an unfolded electronic tablet 60b that includes liquid crystal display devices 50 according to the present embodiment. FIG. 9 is a cross-sectional view of the folded electronic tablet 60b.

As illustrated in FIGS. 8 and 9, the electronic tablet 60b includes a pair of liquid crystal display devices 50, a pair of cases 52a and 52b for housing the liquid crystal display devices 50, and a hinge 53 for joining the cases 52a and 52b. The liquid crystal display devices 50 in the multi-display device 60b are fixed to the cases 52a and 52b with metallic screws or plastic hooks.

The cases 52a and 52b have an opening through which the display area D of the liquid crystal display devices 50 (liquid crystal display panels 40) is exposed.

The hinge 53 is configured to switch between the unfolded state and the folded state (foldable). The unfolded state allows display on the two screens of the liquid crystal display devices 50 in the cases 52a and 52b, as illustrated in FIG. 8. In the folded state, the cases 52a and 52b face each other, as illustrated in FIG. 9.

As described above, the width of the frame region F in each of the liquid crystal display devices 50 of the electronic tablet 60b according to the present embodiment is reduced as much as possible. Thus, a collapsible electronic device (that allows display on two screens) having a narrow frame can be realized with a pair of liquid crystal display devices 50 foldably joined together. Thus, the electronic tablet 60b can have a reduced external size.

Although the electronic tablet 60b includes the liquid crystal display devices 50 having a chassis 46 in the present embodiment, the liquid crystal display panel 40, the backlight 45, and other components may be directly housed in the cases 52a and 52b without the chassis 46.

Although a liquid crystal display device is exemplified as a display device in these embodiments, the present invention can also be applied to another display device, such as an organic electro luminescence (EL) display device.

Although an active-matrix liquid crystal display device is exemplified in these embodiments, the present invention can also be applied to a passive-matrix display device.

Although a method for manufacturing a liquid crystal display device using a one drop fill (ODF) method is exemplified in these embodiments, the present invention can also be applied to a method for manufacturing a liquid crystal display device using a vacuum injection method.

Although an electrode of TFT connected to a pixel electrode is a drain electrode in an active-matrix substrate in these embodiments, the present invention can also be applied to an active-matrix substrate in which an electrode of TFT connected to a pixel electrode is a source electrode.

INDUSTRIAL APPLICABILITY

As described above, the present invention can reduce the width of the frame region and is therefore useful for a display device that requires frame narrowing.

REFERENCE SIGNS LIST

D display area
F frame region
L laser beam
7 resin substrate layer
10a, 10b insulating substrate (glass substrate)
20 active-matrix substrate (first substrate)
20a active-matrix original substrate (first original substrate)
25 liquid crystal layer (display medium layer)
26 sealing member
30 counter substrate (second substrate)
40a laminate
41 IC chip (electronic component)
41a gate driver IC chip (electronic component)
41b source driver IC chip (electronic component)
42 FPC (electronic component)
45 backlight
60a multi-display device (electronic device)
60b electronic tablet (electronic device)

The invention claimed is:
1. A method for manufacturing a display device, comprising the steps of:
forming a display area for image display on a glass substrate and forming a flexible resin substrate layer on the outside of the display area to manufacture a first original substrate;
forming a display area for image display on a glass substrate to manufacture a second substrate;

placing a sealing member around the display area of the first original substrate or the second substrate, and bonding the first original substrate and the second substrate together such that the display areas are superposed with each other with the sealing member and a display medium layer inside the sealing member interposed therebetween, thereby manufacturing a laminate;

mounting a driving electronic component on the resin substrate layer in the first original substrate of the laminate; and removing a portion of the glass substrate outside the sealing member disposed on the back side of the resin substrate layer on which the electronic component has been mounted such that the periphery of the first substrate overlaps the periphery of the second substrate; wherein the step of removing a substrate involves laser beam irradiation from the back side of the resin substrate layer to separate the resin substrate layer from the portion of the glass substrate to be removed.

* * * * *